United States Patent
Sobolewski et al.

(10) Patent No.: US 7,049,593 B2
(45) Date of Patent: *May 23, 2006

(54) SUPERCONDUCTING SINGLE PHOTON DETECTOR

(75) Inventors: Roman Sobolewski, Pittsford, NY (US); Grigory N. Gol'tsman, Moscow (RU); Alexey D. Semenov, Moscow (RU); Oleg V. Okunev, Moscow (RU); Kenneth R. Wilsher, Palo Alto, CA (US); Steven A. Kasapi, San Francisco, CA (US)

(73) Assignees: Credence Systems Corporation, Milpitas, CA (US); University of Rochester, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/969,315

(22) Filed: Oct. 19, 2004

(65) Prior Publication Data

US 2005/0051726 A1  Mar. 10, 2005

Related U.S. Application Data

(63) Continuation of application No. 09/628,116, filed on Jul. 28, 2000, now Pat. No. 6,812,464.

(51) Int. Cl.
*H01L 39/00* (2006.01)

(52) U.S. Cl. .................. 250/336.2; 250/338.1
(58) Field of Classification Search ............ 250/336.2, 250/338.1
See application file for complete search history.

(56) References Cited

U.S. PATENT DOCUMENTS

| | | | | |
|---|---|---|---|---|
| 3,691,381 A | 9/1972 | Kleppner | ............... | 250/83.3 R |
| 4,037,102 A | 7/1977 | Hoyle et al. | ................. | 250/336 |
| 4,843,446 A * | 6/1989 | Nishino et al. | ................ | 257/32 |
| 4,873,482 A * | 10/1989 | Gray | .......................... | 324/71.4 |
| 4,894,542 A | 1/1990 | Schneider | ................ | 250/336.2 |
| 4,935,626 A | 6/1990 | Schneider | ................ | 250/336.2 |
| 4,987,305 A | 1/1991 | Bornstein et al. | ........... | 250/352 |
| 5,185,527 A | 2/1993 | Bluzer | ...................... | 250/336.2 |
| 5,285,067 A | 2/1994 | Culbertson et al. | ....... | 250/336.2 |
| 5,354,989 A | 10/1994 | Fenner et al. | ............. | 250/336.2 |
| 5,532,485 A | 7/1996 | Bluzer et al. | ............. | 250/336.2 |
| 5,828,068 A | 10/1998 | Weirauch | ............... | 250/370.13 |
| 5,850,098 A | 12/1998 | Butler et al. | ................ | 257/467 |
| 5,880,468 A | 3/1999 | Irwin et al. | .............. | 250/336.2 |
| 5,940,545 A | 8/1999 | Kash et al. | ................ | 382/312 |
| 5,965,900 A | 10/1999 | Peacock et al. | ............... | 257/34 |
| 6,211,519 B1 * | 4/2001 | Nam et al. | ............... | 250/336.2 |
| 6,812,464 B1 * | 11/2004 | Sobolewski et al. | ..... | 250/336.2 |

OTHER PUBLICATIONS

Komiyama et al., "A Single-Photon Detector in the Far-Infrared Range", *Nature*, vol. 403, pp. 405-407 (Jan. 27, 2000).

(Continued)

*Primary Examiner*—Albert Gagliardi
(74) *Attorney, Agent, or Firm*—Dorsey & Whitney LLP

(57) ABSTRACT

A single-photon detector includes a superconductor strip biased near its critical current. The superconductor strip provides a discernible output signal upon absorption of a single incident photon. In one example, the superconductor is a strip of NbN (niobium nitride). In another example, the superconductor strip meanders to increase its probability of receiving a photon from a light source. The single-photon detector is suitable for a variety of applications including free-space and satellite communications, quantum communications, quantum cryptography, weak luminescence, and semiconductor device testing.

34 Claims, 13 Drawing Sheets

OTHER PUBLICATIONS

Ll'in et al., "Picosecond Hot-Electron Energy Relaxation in NbN Superconducting Photodetectors," *Applied Physics Letters*, vol. 76, No. 19, pp. 2752-2754, (May 8, 2000).

NewsByte Detail, "Quantum Dots Detect Single Photons", Optics.org webpage, 2 pages, (posted Jun. 2, 2000).

Ghis et al., "Electrical Picosecond Measurements of the Photoresponse in YBa(2)Cu(3)O(7-x)," *Applied Physics Letters*, 63, 551 (1993).

Kadin et al., "Nonequilibrium Photon-Induced Hotspot: A New Mechanism for Photodetection in Ultrathin Metallic Films", *Applied Physics Letters*, 69 (25), pp. 3938-3940 (Dec. 16, 1996).

Zhang et al., "Thermal and Nonequilibrium Responses of Superconductors for Radiation Detectors" *Journal of Superconductivity*, vol. 7, No. 6, pp. 871-884 (1994).

Crittenden et al., "Superconducting Thin-Film Detector of Nuclear Particles" *Journal of Applied Physics*, vol. 42, No. 8, pp. 3182-3188 (Jul. 1971).

Booth et al., "Topical Review Superconducting Particle Detectors" *Supercond. Sci. Technol.* 9 pp. 493-516 (1996).

Gupta et al., "Single-Photon-Counting Hotspot Detector With Integrated RSFQ Readout Electronics", *IEEE Transactions on Applied Superconductivity*, vol. 9, No. 2, pp. 4487-4490 (Jun. 1999).

Il'in et al., "Ultimate Quantum Efficiency of a Superconducting Hot-Electron Photodetector", *Applied Physics Letters*, vol. 73, No. 26, pp. 3938-3940 (Dec. 28, 1998).

Somani et al., "New Photon Detector for Device Analysis: Super Conducting Single-Photon Detector Based on a Hot Electron Effect", *Journal of Vacuum Science & Technology B*, vol. 19, No. 6, pp. 2766-2769 (Nov./Dec. 2001).

Gol'tsman et al., "Fabrication and Properties of an Ultrafast NbN Hot-Electron Single-Photon Detector", *IEEE Transactions on Applied Superconductivity*, vol. 11, No. 1, pp. 574-577 (Mar., 2001).

* cited by examiner

SUPERCONDUCTING SINGLE PHOTON DETECTOR

CROSS-REFERENCE TO RELATED APPLICATION

This application is a continuation of U.S. application Ser. No. 09/628,116 filed Jul. 28, 2000, which issued on Nov. 2, 2004 as U.S. Pat. No. 6,812,464, which is hereby incorporated by reference as though fully disclosed herein.

BACKGROUND OF THE INVENTION

1. Field of the Invention

The present disclosure generally relates to photodetectors and more particularly to single photon detectors.

2. Description of the Related Art

A photodetector is a device that provides an electrical voltage or electrical current output signal when light is incident thereon. There are two basic types of photodetectors: linear detectors and quantum detectors. Linear detectors provide an output signal that is a linear function of the incident light intensity or average optical power. Quantum detectors provide an output signal upon detection of photons of the incident light.

A single-photon detector is a quantum detector that can detect one incident photon at a time. Commercially available single photon detectors detect photons in the visible and shorter wavelength optical regions of the electromagnetic spectrum. These commercially available detectors include silicon avalanche photodiodes (si APDs), such as part number C30954 from EG&G Optoelectronics. A typical Si APD has a responsivity of 70 A/W (amps/watt) for photons with wavelengths of 900 nm, which drops to 36 A/W for photons with wavelengths of 1064 nm. Currently available Si APDs are not sensitive enough to detect photons with wavelengths longer than 1100 nm.

Characteristics of hot-electron photodetectors that are fabricated from superconducting NbN (niobium nitride) films are discussed in K. S. Il'in, I. I. Milostnaya, A. A. Verevkin, G. N. Gol'tsman, E. M. Gershenzon, and Roman Sobolewski, "Ultimate Quantum Efficiency Of A Superconducting Hot-Electron Photodetector," *Applied Physics Letters* Vol. 73, No. 26 (Dec. 18, 1998), pages 3938–3940 and in K. S. Il'in, M. Lindgren, M. Currie, A. D. Semenov, G. N. Gol'tsman, Roman Sobolewski, S. I. Chereduichenko, and E. M. Gershenzon, "Picosecond Hot-Electron Energy Relaxation in NbN Superconducting Photodetectors," *Applied Physics Letters* Vol. 76, No. 19 (May 8, 2000), pages 2752–2754. Both publications are incorporated herein by reference. Some of the authors of the above mentioned articles are also inventors of this disclosure. While the first article suggests that "NbN HEPs should be able to detect single quanta of the far-infrared radiation and successfully compete as single-photon detectors with SIS-tunnel devices" (*Applied Physics Letters*, Vol. 73, No. 26 at p. 3940), there is no further relevant disclosure. The second article discusses the intrinsic response times of the hot-electron effect in NbN's, which applies to both linear and quantum NbN photodetectors.

SUMMARY

The present disclosure addresses the above mentioned limitation of prior art photodetectors by providing a single-photon, time-resolving detector with good quantum efficiency for photons in the wavelengths from the visible to the far infrared spectral region.

In one embodiment, the single-photon detector includes a strip of superconducting material. The superconductor is biased with electrical current that is near the superconductor's critical current. The superconductor provides a discernible output pulse signal upon absorption of a single incident photon. In one embodiment, the superconductor is a narrow strip of NbN film. In another embodiment, the superconductor has a meandering shape to increase its surface area and thus also the probability of absorbing a photon from a light source.

The present single-photon detector can be used in a variety of applications including free-space and satellite communications, quantum communications, quantum cryptography, weak luminescence, and semiconductor device testing.

BRIEF DESCRIPTION OF THE DRAWINGS

The use of the same reference symbol in different figures indicates the same or identical elements. Further, the figures in this disclosure are schematic representations and not drawn to scale.

DETAILED DESCRIPTION

Figure 1A:
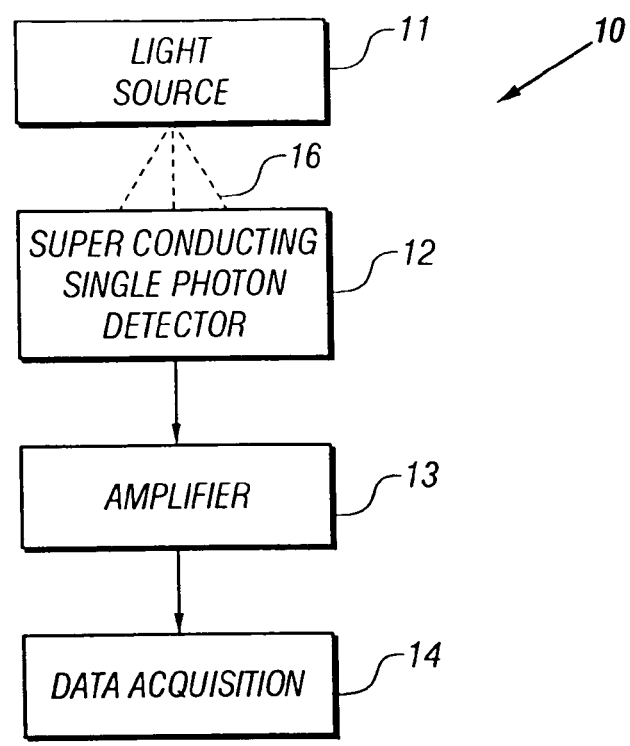
FIG. 1A shows a block diagram of a photon counter using the present superconducting single-photon detector (SSPD).

FIG. 1A shows a block diagram of a photon counter 10 including a superconducting single-photon detector (SSPD) in accordance with an embodiment of the invention. Referring to FIG. 1A, an SSPD 12 detects photons 16 emitted by a light source 11, which includes suitable optics (not shown). It is to be understood that light source 11 is not necessarily a part of photon counter 10 and is, for example, a transistor which emits photons when switching. Upon absorption of an incident photon, SSPD 12 in response generates an electrical output pulse signal that is amplified by associated amplifier 13. Each output pulse signal is recorded and counted by data acquisition system (DAQ) 14 (e.g., a computer equipped with appropriate interface circuitry and software).

Figure 1B:
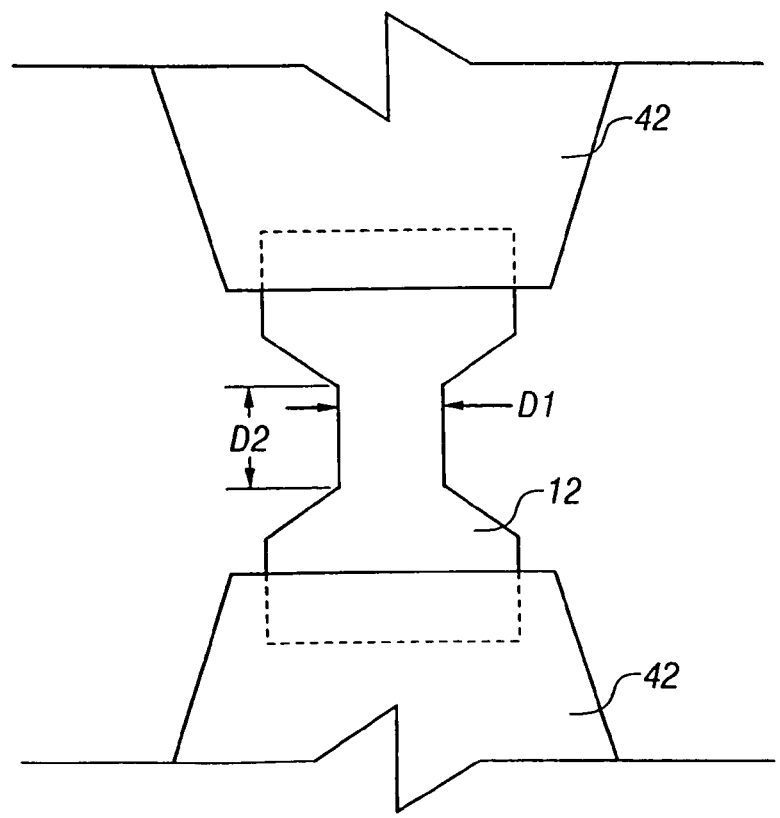
FIG. 1B shows a plan view of an SSPD.

In one embodiment, SSPD 12 is a narrow, thin strip of a superconducting material that is electrically biased to provide an output pulse signal upon absorption of a single incident photon. As shown in the plan view of FIG. 1B, SSPD 12, in this example, is a narrow strip of NbN (niobium nitride) film having a width D1 of about 200 nm, a length D2 of about 1 µm, and a thickness of about 5 nm. A direct current (DC) bias source (not shown) provides biasing current to SSPD 12 through gold contact pads 42. SSPD 12 and contact pads 42 are conventionally disposed on a substrate; suitable substrates include sapphire and quarts for infrared and visible light applications. Silicon can also be used as a substrate, e.g. for infrared applications. SSPD 12 typically, but not necessarily, faces light source 11. In the absence of incident photons and while SSPD 12 is conventionally cooled to a superconducting state, the voltage across SSPD 12 is zero because SSPD 12 is a superconductor and hence has zero resistance when in the superconducting state. A photon incident on SSPD 12 switches it into the resistive state, thereby developing a voltage drop across SSPD 12 detected by DAQ 14.

As is well known, a superconductor, such as SSPD 12, remains in a superconducting state only while the amount of current being carried by the superconductor, the temperature of the superconductor, and the external magnetic field surrounding the superconductor are maintained below certain values referred to as critical values. The critical values (i.e., critical current, critical temperature, and critical magnetic field) are characteristic of the superconducting material and its dimensions. To maintain SSPD 12 in the superconducting state in the absence of incident photons, SSPD 12 is maintained at a temperature below 10 Kelvin (the approximate critical temperature of a thin NbN film) such as 4.2 Kelvin and exposed to ambient Earth magnetic field as is conventional with superconductors. The biasing current through SSPD 12 is set just below the critical current to increase its sensitivity, thereby allowing single-photon detection. The critical current of SSPD 12 is experimentally determined by maintaining SSPD 12 well below its critical temperature and critical magnetic field and then increasing the amount of current flown through SSPD 12 until it transitions from a superconducting state (zero resistance) to a resistive state (some resistance).

Figure 2A:
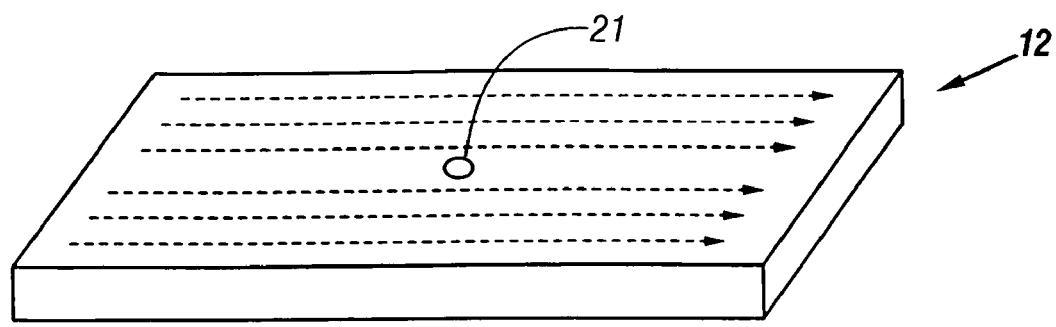
FIGS. 2A–2D graphically illustrate the physical process which the inventors believe gives rise to the voltage that develops across an SSPD upon absorption of a single photon.
Figure 2B:
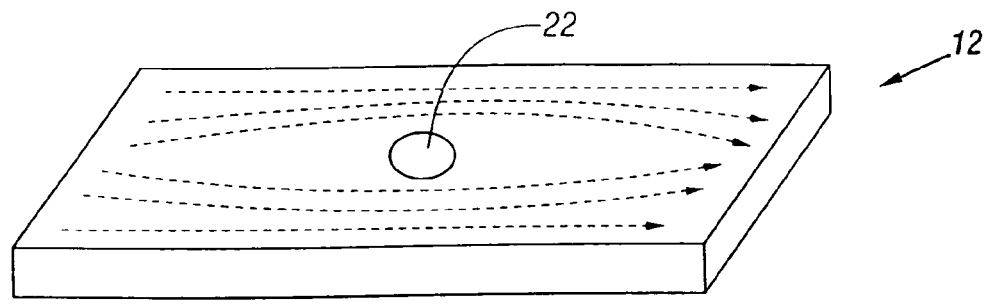
Figure 2C:
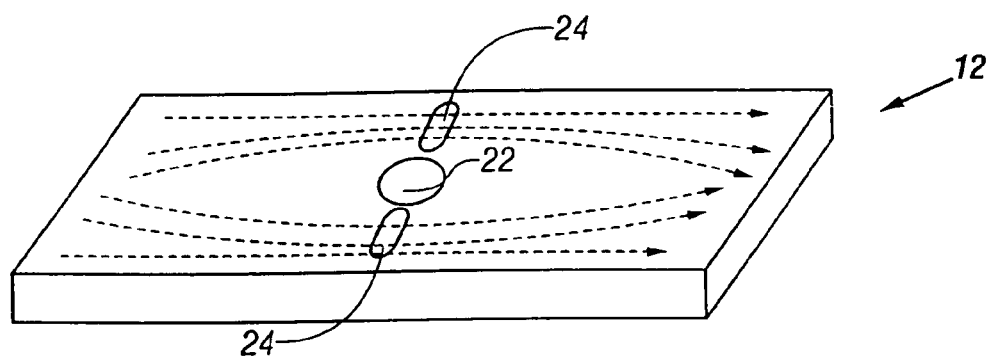
Figure 2D:
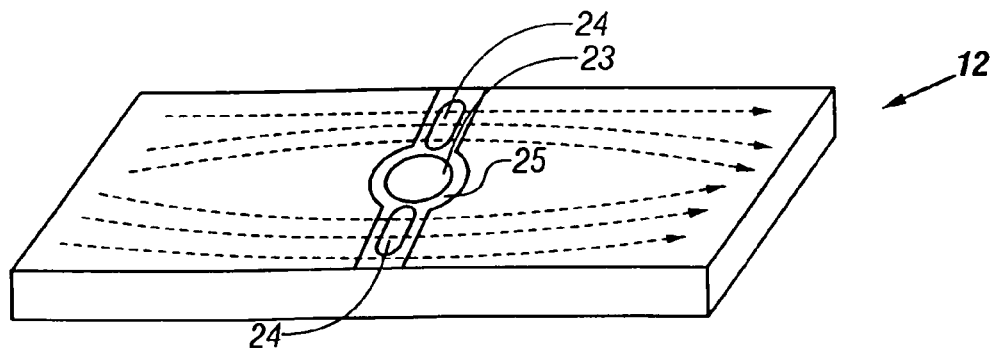

FIGS. 2A–2D graphically illustrate the physical process which the inventors believe gives rise to the voltage pulse that develops across SSPD 12 upon absorption of a single photon. However, understanding of this is not necessary for making or using the SSPD. The dashed arrows in FIGS. 2A–2D schematically represent the flow of the biasing current through SSPD 12. Referring to FIG. 2A, a photon incident on SSPD 12 creates a hot spot 21, a region where the temperature of electrons is much higher than SSPD 12's ambient temperature. The diameter of hot spot 21 directly depends on the energy of the incident photon. Within a few picoseconds, hot spot 21 diffuses further across SSPD 12 and becomes a larger hot spot 22 (FIG. 2B). Hot spot 22 defines a region in SSPD 12 that is no longer superconducting. Because hot spot 22 is a resistive region, the biasing current is forced to flow around hot spot 22 and into regions between hot spot 22 and the edges of SSPD 12 that are still superconducting. This increases the current density in the still superconducting regions above the critical current density, thereby destroying superconductivity and creating resistive regions 24 (also known as phase slip centers) (FIG. 2C). Thus, a resistive region 25 (FIG. 2D) is formed across the entire width of SSPD 12. Biasing current flowing through resistive region 25 develops a voltage signal across SSPD 12.

Following the formation of hot spot (i.e., resistive) regions is the cooling process associated with the diffusion of electrons out of the hot spot regions and simultaneous reduction of the electrons' temperature via the electron-phonon energy relaxation mechanism. The cooling process takes a few tens of picoseconds and results in the automatic disappearance of the hot spot (and resistive region 25) and reestablishment of a superconducting path across SSDP 12. The hot spot formation and the healing processes result in an output voltage signal having a pulse shape with an intrinsic width of approximately 30 ps. The width of the voltage pulse is determined by the specifics of the superconducting material and the energy of the incident photon. Because the output voltage pulse has a duration of only tens of picoseconds, SSPD 12 (and other SSPDs in accordance with this disclosure) can time resolve incident photon energy, and can distinguish photons arriving at a very high rate (e.g., above $10^9$ photons per second).

Referring back to FIG. 1B, dimension D1 of SSPD 12 is, in one embodiment, about 200 nm. If dimension D1 is significantly wider than 200 nm, a detectable resistive region 25 (FIG. 2D) may not be formed as the biasing current may remain superconducting at all times and be able to flow around the resulting hot spot without exceeding the current density around the hot spot. Dimension D1 can be increased for detection of very high energy (e.g., ultraviolet) photons. For detecting red to short-infrared photons, a dimension D1 of 200 nm is suitable for an NbN SSPD. The length of the narrow section, dimension D2, is 1 µm in one embodiment. The length of the narrow section does not affect the physical process that gives rise to the output voltage pulse but does change the surface area and hence the overall quantum efficiency of SSPD 12. The thickness of the narrow section is about 5 nm in one embodiment. The thickness of an SSPD directly affects the hot electron thermalization and relaxation processes, which are responsible for the healing of hot spots. Of course, the dimensions and critical values provided here are specific to the disclosed examples (which are designed to detect red and short-infrared photons) and can be varied depending on the energy levels of the photons of interest and the superconducting material used. For example, the dimensions of SSPD 12 can be modified to detect photons having wavelengths in the ultraviolet, visible, or far infrared spectral region.

In general, any thin and narrow strip of superconducting material can be used as an SSPD in accordance with this disclosure. Other metallic superconductors (so-called low-temperature superconductors), such as Nb (niobium), Pb (lead), or Sn (tin) can be fabricated with somewhat wider D1 dimension for detecting red and short-infrared photons. However, these other metallic superconductors are not as time resolving as is NbN because of their significantly longer output voltage response (in nanosecond to even microsecond range) which is due to their slow hot electron relaxation process. Recently discovered high-temperature superconductors, such Y—Ba—Cu—O (yttrium-barium-copper oxide compound), are predicted to require a D1 dimension on the order of about 10 nm to 100 nm and have a response time on the order of about 1 ps.

Figure 1C:
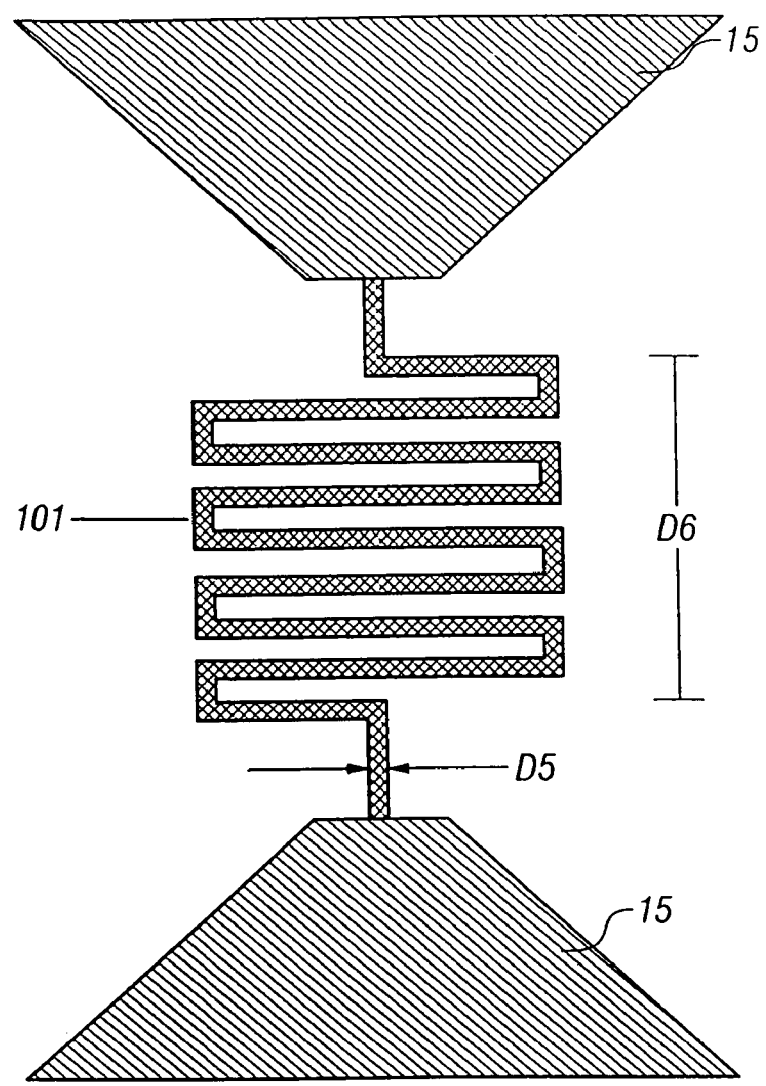
FIG. 1C shows a plan view a of an SSPD having a meandering shape.

FIG. 1C shows a plan view of a superconducting single photon detector 101 (SSPD 101) of the same type as SSPD 12. SSPD 101 has a meandering shape to maximize its top surface area and thereby increase its probability of receiving an incident photon from a light source. In one example, SSPD 101 is a continuous NbN film having a width D5 of about 0.2 μm, a device length D6 of about 3 μm, and a thickness of about 5 nm. Other meandering shapes (e.g., zigzag shape) can also be used.

Figure 3A:
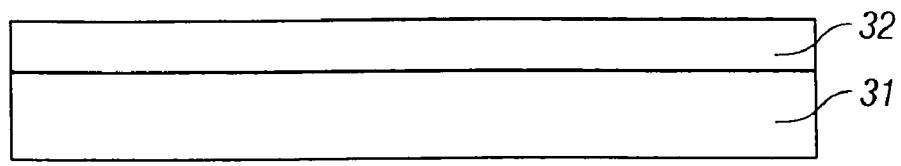
FIGS. 3A–3L show cross-sectional views of an SSPD being fabricated.

FIGS. 3A–3L show cross-sectional views of a superconducting single photon detector, such as SSPD 12, being fabricated in accordance with one embodiment. Steps that are well known and not necessary to the understanding of the fabrication process have been omitted. Further, while specific fabrication process parameters are provided, other embodiments are not so limited because one of ordinary skill in the art can use other fabrication processes to make an SSPD. Referring to FIG. 3A, a 5 nm thick NbN film 32 is deposited on a substrate 31 by reactive magnetron sputtering. The reactive magnetron sputtering process is performed using an LH Z-400 sputtering system of the type supplied by Leybold-Herauss of Germany with the following parameters:

residual pressure is $1.3 \times 10^{-6}$ mbar;
substrate temperature is 900° C.;
partial $N_2$ pressure is $1.3 \times^{-5}$ mbar;
partial Ar pressure is $1.3 \times^{-3}$ mbar;
discharge voltage is 260V;
discharge current is 300 mA.

Substrate 31 is, for example, a 350 μm thick sapphire substrate that is polished on the active side. Other substrates can also be used such as a 125 μm thick Z-cut single crystal quartz polished on both sides. Any high-quality dielectric material that has low microwave loss and good cryogenic properties can be used as a substrate.

Figure 3B:
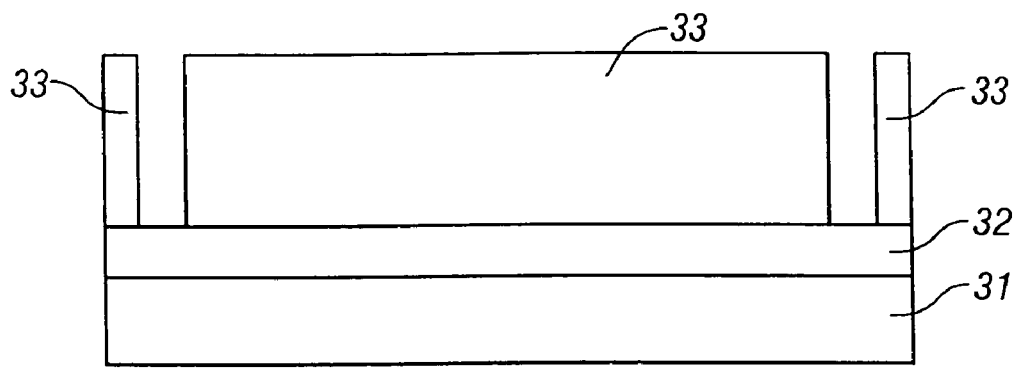
Figure 3C:
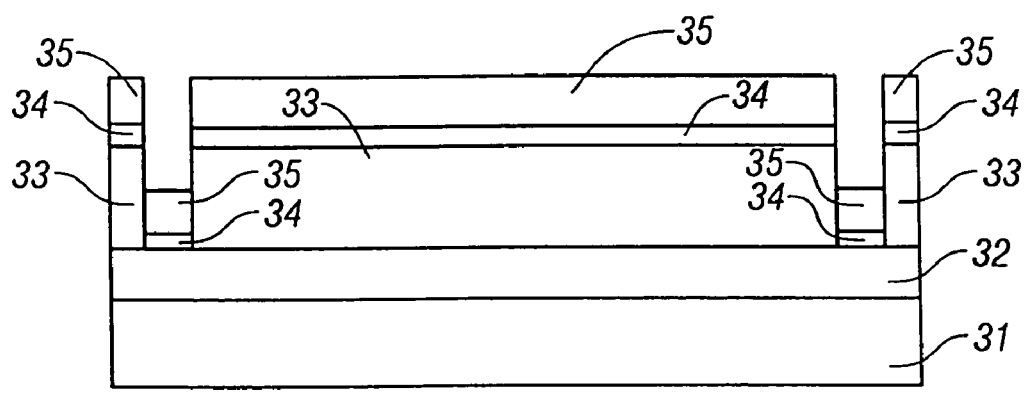
Figure 3D:
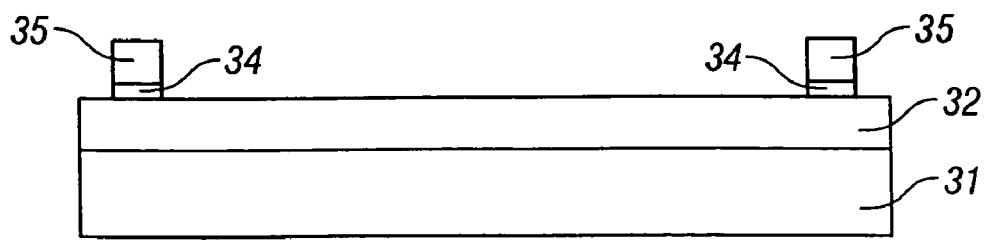

FIGS. 3B–3D illustrate the formation of alignment structures on NbN 32 for subsequent photolithography and electron beam lithography steps. In FIG. 3B, a 1.0–1.5 μm thick photoresist mask 33 is formed and patterned on NbN 32 by conventional photolithography using the following parameters:

photoresist material is AZ 1512;
spinning at 3000–5000 rps;
baking at 90° C., 30 minutes.

A KARL SUSS MA-56 aligner is used to align photoresist mask 33 over NbN 32. Over the resulting structure, a 100 nm thick gold layer 35 is formed on top of a 5 nm thick titanium layer 34 using a double layer metallization process (FIG. 3C). Gold layer 35 and titanium layer 34 are formed by vacuum evaporation at room temperature and at a residual pressure of $1.5 \times 10^{-5}$ Torr. Photoresist mask 33 is lifted off by immersing the structure in warm acetone for about 3 minutes or longer, leaving alignment structures consisting of gold layer 35 and titanium layer 34 (FIG. 3D).

Figure 3E:
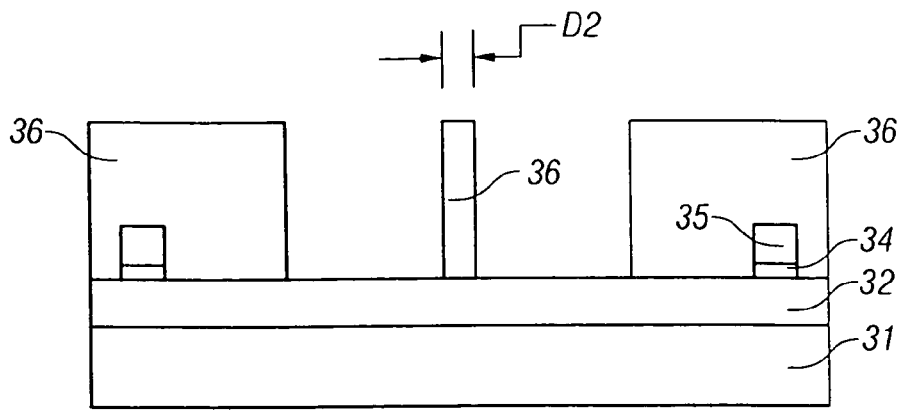
Figure 3F:
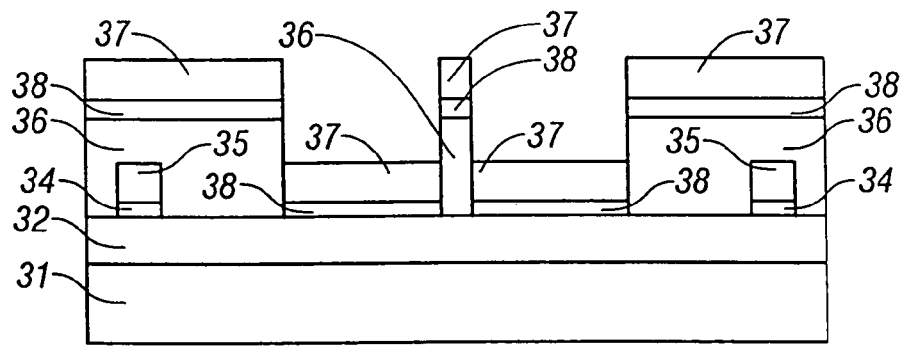
Figure 3G:
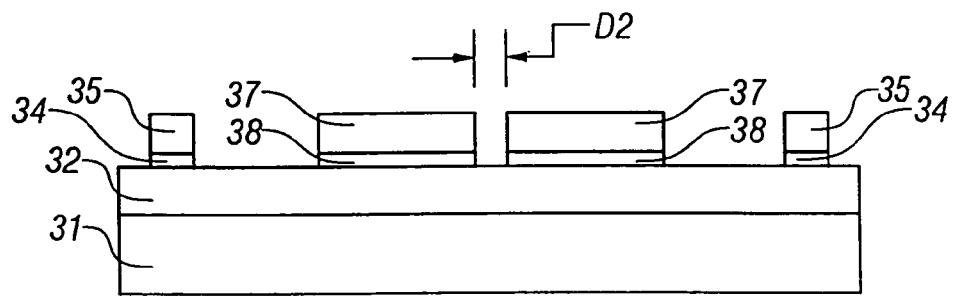

FIGS. 3E–3G illustrate the formation of internal contact pads on NbN 32. In FIG. 3E, a 400 nm thick electron resist mask 36 is formed and patterned on NbN 32 by conventional electron beam lithography using the following parameters:

electron resist material is PMMA 950, 475;
spinning at 3000 rpm;
baking at 130° C., 10–30 minutes;
electron beam exposure current is 30 pA;
electron beam exposure voltage is 25 kV.

The length of the middle section of electron resist mask 36, shown in FIGS. 3E and 3G as dimension D2 (also, see FIG. 1B), can be varied from about 0.15 μm to 10 μm to change the effective length of the SSPD in one embodiment. Electron resist mask 36 is cleaned in an oxygen plasma using the following parameters:

$O_2$ pressure is $10^{-2}$ Torr;
residual pressure is $10^{-5}$ Torr;
discharge current of 10 mA;
process time of 15 seconds.

A 400 nm thick gold layer 37 is then formed on top of a 3 nm thick chromium layer 38 using a double layer metallization process (FIG. 3F). Gold layer 37 and chromium layer 38 are formed by vacuum evaporation using an LH-960 e-beam evaporation system from Leybold-Herauss of Germany at room temperature and at a residual pressure of $2 \times 10^{-6}$ Torr. Electron resist mask 36 is then lifted off, leaving internal contact pads consisting of gold layer 37 and chromium layer 38 (FIG. 3G).

Figure 3H:
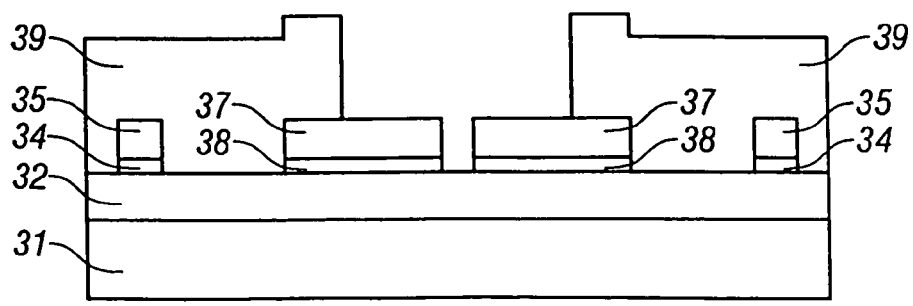
Figure 3I:
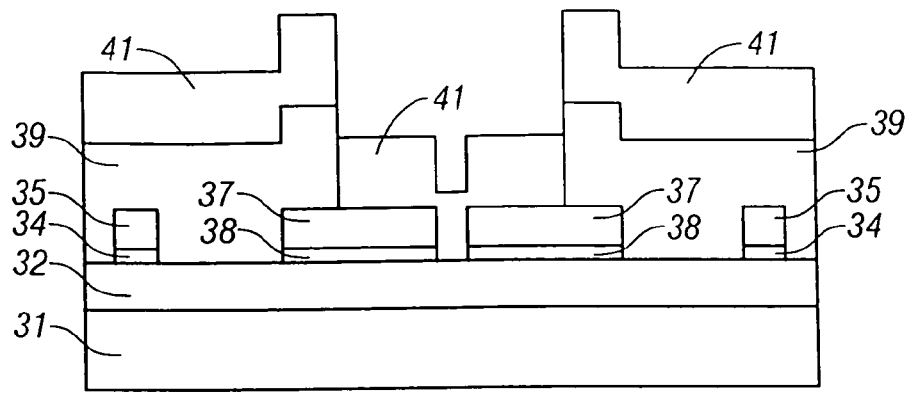
Figure 3J:
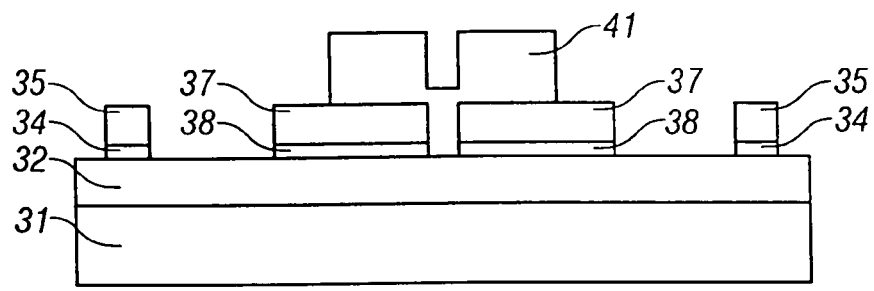

FIGS. 3H–3J illustrate the formation of a silicon dioxide mask ($SiO_2$), a "hard" mask for later ion milling processing steps. In FIG. 3H, electron resist mask 39 is formed on NbN 32 using a process similar to that used to form electron resist mask 36 discussed above. A $SiO_2$ layer 41 is then vacuum evaporated on the resulting structure as shown in FIG. 3I. Electron resist mask 39 is lifted off, leaving an $SiO_2$ mask consisting of $SiO_2$ layer 41 (FIG. 3J). The $SiO_2$ mask, which is transparent to the photons, defines the width of the SSPD.

Figure 3K:
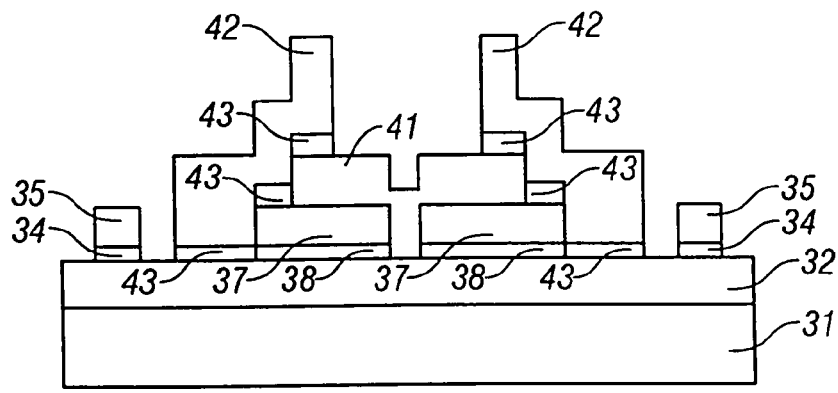
Figure 3L:
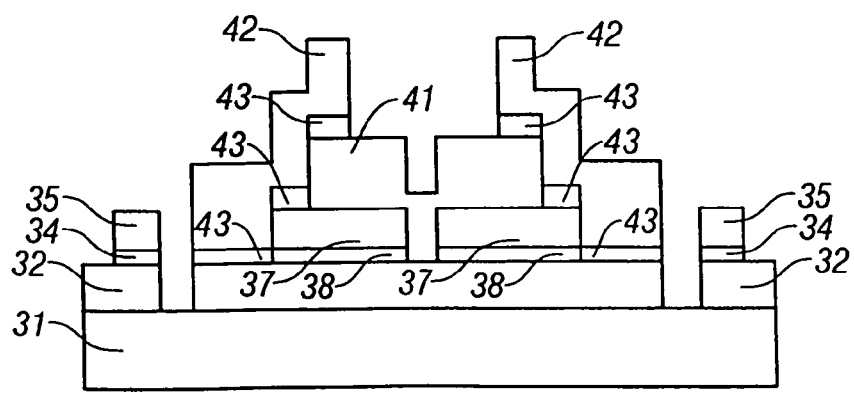

External contact pads, consisting of 200 nm thick gold layer 42 on top of 7–10 nm thick titanium layer 43, for coupling NbN 32 to external equipment such as a bias source are formed as shown in FIG. 3K. The external contact pads are formed using a process similar to that used to form gold layer 37 and chromium layer 38. Portions of NbN 32 between the external contact pads and the alignment structures are then removed by argon ion milling, defining the SSPD device (FIG. 3L).

Figure 4A:
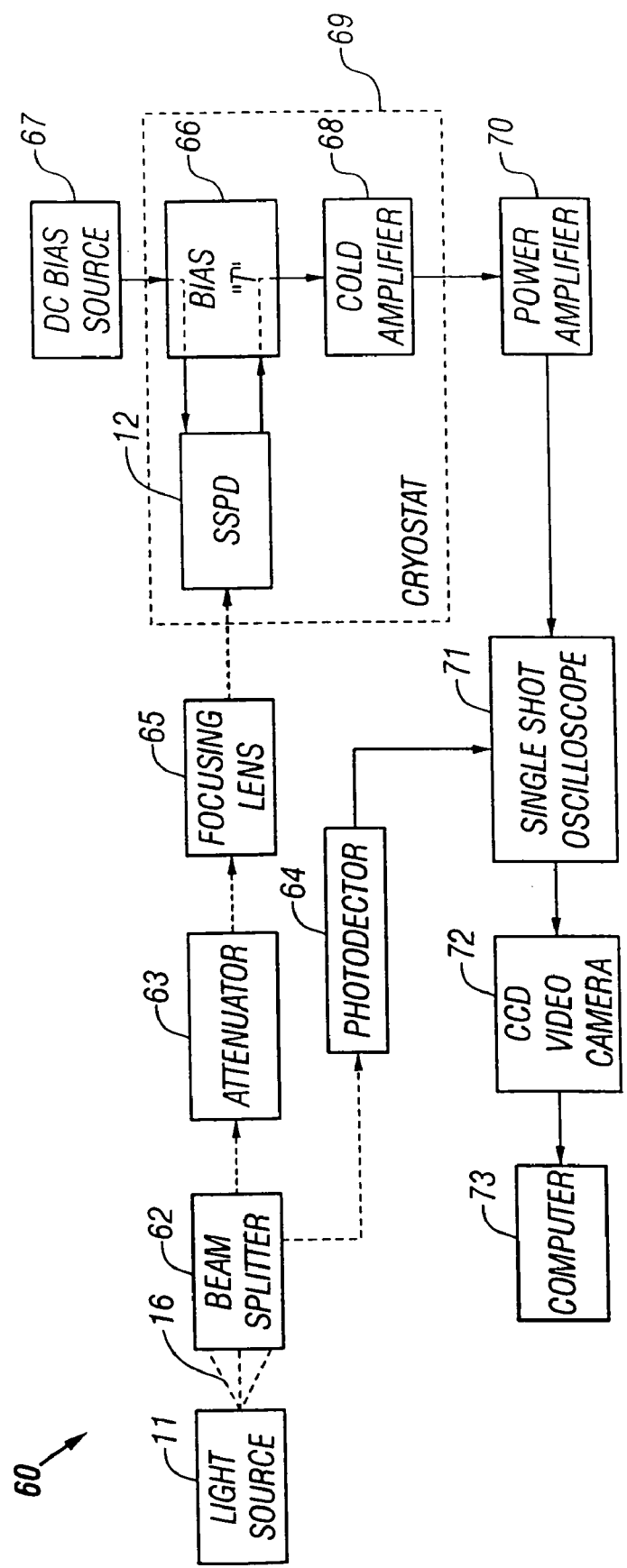
FIG. 4A shows a block diagram of an apparatus including the present SSPD.

FIG. 4A shows a block diagram of a pulse counter 60 including an SSPD 12. In pulse counter 60, SSPD 12 is a 200 nm wide, 1 μm long, and 5 nm thick NbN film. Light source 11 outputs light pulses 16 to a beam splitter 62, which splits the light for input to an attenuator 63 and a photodetector 64. In pulse counter 60, light source 11 is a laser that generates short light pulses at a repetition rate of about 76 MHz when it is a modelocked IR laser from Coherent Laser Group (MIRA laser) or about 82 MHz when it is a modelocked laser from Spectra-Physics (Tsunami laser). Light source 11 can also be a GaAs semiconductor laser modulated from 1 Hz to 3 kHz. The wavelength of the photons from light source 11 is approximately 810 nm in this example. In other experiments, single photon detection was also achieved with photons having wavelengths of 500 nm to 2100 nm. Attenuator 63 is a series of absorbing filters used to reduce the number of photons incident on SSPD 12 to an average of less than one photon per pulse. For example, absorbing filters can be added to or removed from attenuator 63 so that the probability of having a photon in each pulse is 0.01, resulting in an average of one photon every 100 pulses.

Photons passing through attenuator 63 are focused onto SSPD 12 using conventional focusing lens 65. A direct current (DC) bias source 67 provides biasing current to SSPD 12 through a wide-band "cold" bias-T 66 (also shown in FIG. 4B). The output signal of SSPD 12 is coupled to a "cold" amplifier 68, through bias-T 66, for amplification prior to being transmitted outside a cryostat 69. Cryostat 69 is a conventional liquid helium cryostat that maintains SSPD 12 at a temperature below its critical temperature. Cold amplifier 68, a conventional cryogenic power amplifier, has a thermal equivalent noise ($T_{noise}$) of about 5 Kelvin, frequency range of 1–2 GHz, and gain ($K_p$) of 30 dB. Bias-T 66, cold amplifier 68, and SSPD 12 are conventionally housed within cryostat 69. The output signal of cold amplifier 68 is further amplified by a power amplifier 70 to boost the output signal of SSPD 12 to a level detectable by a single shot oscilloscope 71. Power amplifier 70 has a specified peak output power of about 0.2 W, frequency range of 0.9–2.1 GHz, and gain ($K_p$) of 32 dB.

A conventional photodetector 64 detects the split-off light pulses from beam splitter 62 and provides an output signal that triggers oscilloscope 71 to acquire the signal from power amplifier 70. A CCD video camera 72 takes a picture of the screen of oscilloscope 71, which is then downloaded to a computer 73 with video capture hardware for analysis. The data acquisition elements which include oscilloscope 71, CCD video camera 72, and computer 73 are, like the other depicted elements, exemplary.

Figure 4B:
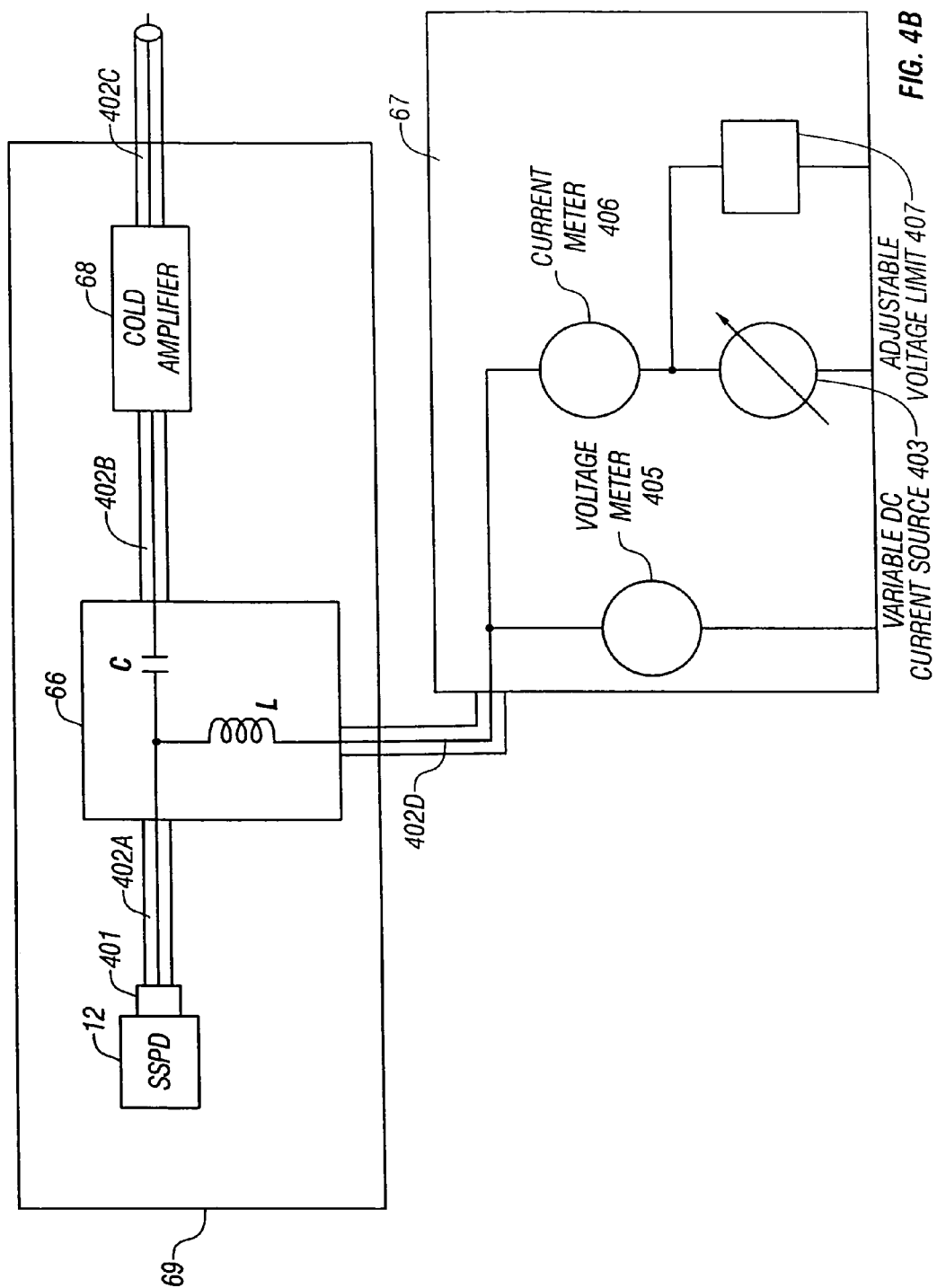
FIG. 4B shows further details of the biasing arrangement for the SSPD shown in FIG. 4A.

FIG. 4B shows further details of the electrical biasing arrangement for SSPD 12. As shown in FIG. 4B, 50-Ohm transmission lines 402 (i.e., transmission lines 402A, 402B, 402C, and 402D) are used to couple SSPD 12 to bias-T 66, DC bias source 67, and cold amplifier 68. The coupling between SSPD 12 and transmission line 402A is through a conventional high-bandwidth connection 401, which is part of the SSPD 12 housing. Bias-T 66 has a DC port and an AC port which are schematically depicted in FIG. 4B as inductor "L" and capacitor "C". The inductor and capacitor of bias-T 66 are preferably not dependent on temperature. One can also measure the performance of a particular bias-T 66 at cryogenic temperatures and determine the appropriate component values based on how the component values shift with temperature. Appropriate component values in this example are 0.2 μH or greater for inductor "L" and 1000 pF or greater for capacitor "C" at a temperature of about 4 Kelvin. The pulsed voltage output signal from SSPD 12 is applied to the AC port of bias-T 66 and amplified by cold amplifier 68 before being transmitted out of cryostat 69 via transmission line 402C. Bias current from DC bias source 67 is provided to SSPD 12 through the DC port of bias-T 66. DC bias source 67 has a variable DC current source 403 for providing bias current, a current meter 406 for reading the supplied bias current, and a voltage meter 405 for reading the voltage across SSPD 12. DC bias source 67 also includes an adjustable voltage limit 407 to limit the voltage across SSPD 12 when it switches to the resistive state. A typical setting for voltage limit 407 is about 3 mV to 5 mV. The critical current of SSPD 12 is determined by maintaining SSPD 12 well below its critical temperature using cryostat 69 (note that the ambient Earth magnetic field is well below the critical magnetic field of SSPD 12). DC current source 403 is then adjusted until SSPD 12 transitions from the superconducting state to the resistive state. The bias current, read using current meter 406, which transitions SSPD 12 into the resistive state is the critical current. SSPD 12 is normally operated with a bias current that is below the critical current. A typical range of biasing current for SSPD 12 is 40–50 μA. Preferably, the biasing current is set as close to the critical current as possible without falsely transitioning SSPD 12 into the resistive state in the absence of an incident photon.

Figure 4C:
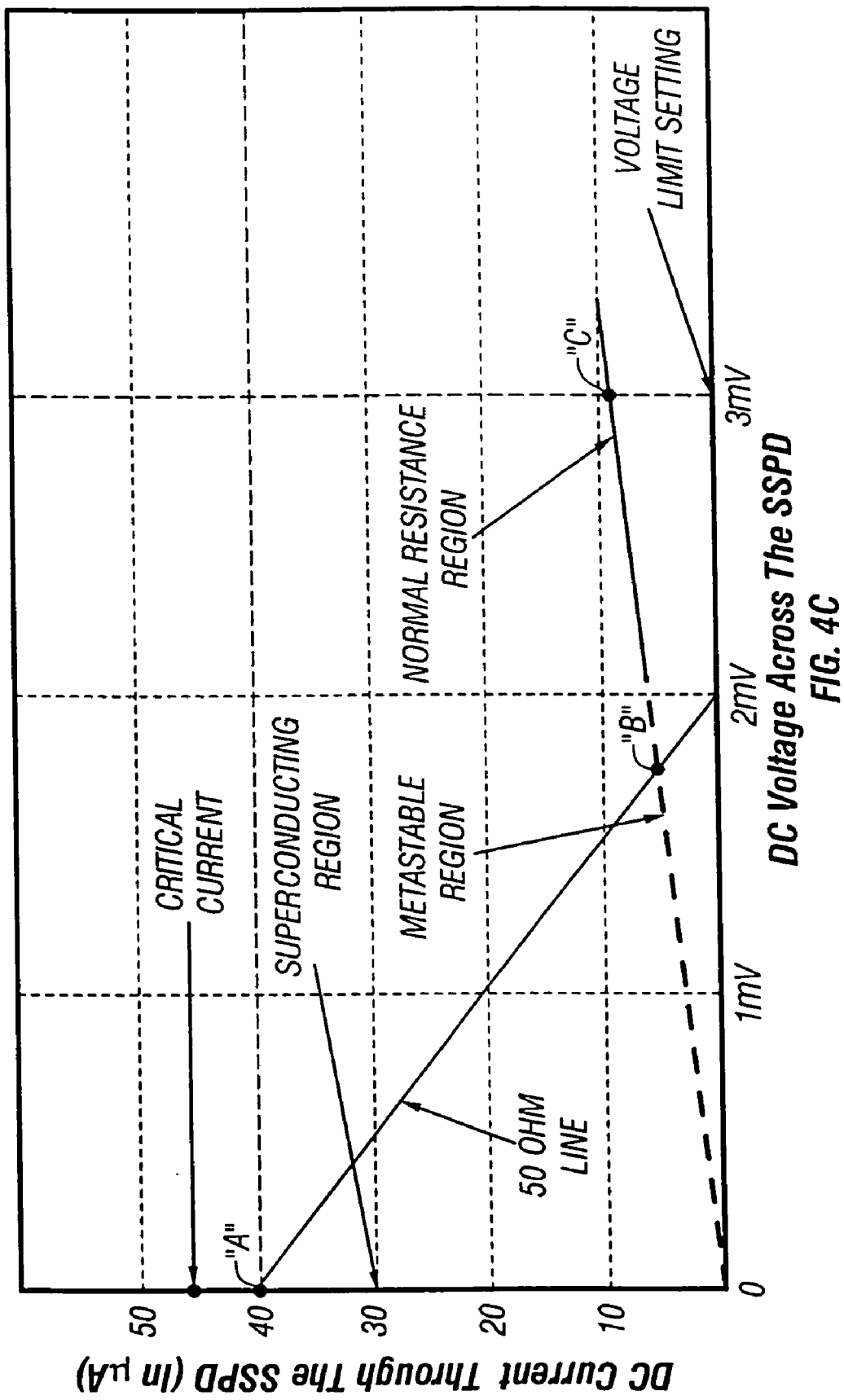
FIG. 4C shows a typical current-voltage (I–V) plot for an SSPD at 4.2 Kelvin.

FIG. 4C shows a typical current-voltage plot for SSPD 12 at 4.2 Kelvin. In FIG. 4C, the vertical axis indicates the DC bias current through SSPD 12 (in μA) as measured by current meter 406 while the horizontal axis indicates the DC voltage drop across SSPD 12 as measured by voltage meter 405 (FIG. 4B). As indicated in FIG. 4C, the critical current of SSPD 12 is approximately 45 μA. As long as the bias current is below the critical current, SSPD 12 remains in the superconducting state represented by the vertical trace beginning at 0 mV. Although the biasing current through SSPD 12 is 40 μA, the voltage across SSPD 12 remains at 0 mV while SSPD 12 is in the superconducting state (because SSPD 12 is a superconductor and hence has zero resistance in the superconducting state). Thus, SSPD 12 remains on operating point "A" under normal conditions. When SSPD 12 absorbs a photon, SSPD 12 can become resistive thereby causing the current through it to drop and the voltage across it to rise. This moves the operating point of SSPD 12 from point "A" to a point "B" on a dashed trace labeled "Meta Stable Region" in FIG. 4C. Note that points "A" and "B" are connected by a solid 50-Ohm load trace, which reflects the impedance of the 50-Ohm transmission line presented to SSPD 12. The separation point between the Meta Stable Region and the Normal Resistance Region is the voltage level corresponding to the critical current multiplied by the 50-Ohm load resistance, which comes out to 2.25 mV (i.e., 45 μA×50Ω=2.25 mV) in the example of FIG. 4C. For a short time (tens of picoseconds) after absorption of the photon, the operating point of SSPD 12 remains on point "B". Thereafter, the operating point of SSPD 12 returns to point "A". If the current through SSPD 12 is increased enough, to slightly above 45 μA in the example shown in FIG. 4C, the bias current will exceed the critical current thereby moving the operating point of SSPD 12 to point "C" on the trace labeled "Normal Resistance Region". While at operating point "C", photon detection is not possible because SSPD 12 will remain in the resistive state until its bias current is lowered below the critical current. Note that the voltage across SSPD 12 on point "C" is limited by the setting of voltage limit 407, which is 3 mV in this example.

As will be demonstrated below, single photon detection requires a linear dependence on the number of absorbed photons. For a mean number of m photons absorbed per laser pulse, the probability of absorbing n photons from a given pulse is $$P(n) = \frac{e^{-m}(m)^n}{n!}$$

When $m \ll 1$, $$P(n) = \frac{m^n}{n!}$$

For the apparatus shown in FIG. 4A, m<<1 can be achieved by adjusting attenuator 63 such that the number of photons incident on SSPD 12 is reduced to an average of much less than one per laser pulse. From the foregoing, the probability of absorbing 1 photon per pulse is $$P(1) = m$$

The probability of absorbing 2 photons per pulse is $$P(2) = \frac{m^2}{2}$$

(Of course, P(2) is the probability of absorbing two photons on the same spot on the superconducting film at the same time; otherwise, the two photons would count as two single photons). The probability of absorbing 3 photons per pulse is $$P(3) = \frac{m^3}{6}$$

Thus, for m<<1, the probability of detecting one photon per pulse is proportional to m, the probability of detecting two photons is proportional to $m^2$, the probability of detecting 3 photons is proportional to $m^3$, and so on.

Figure 5:
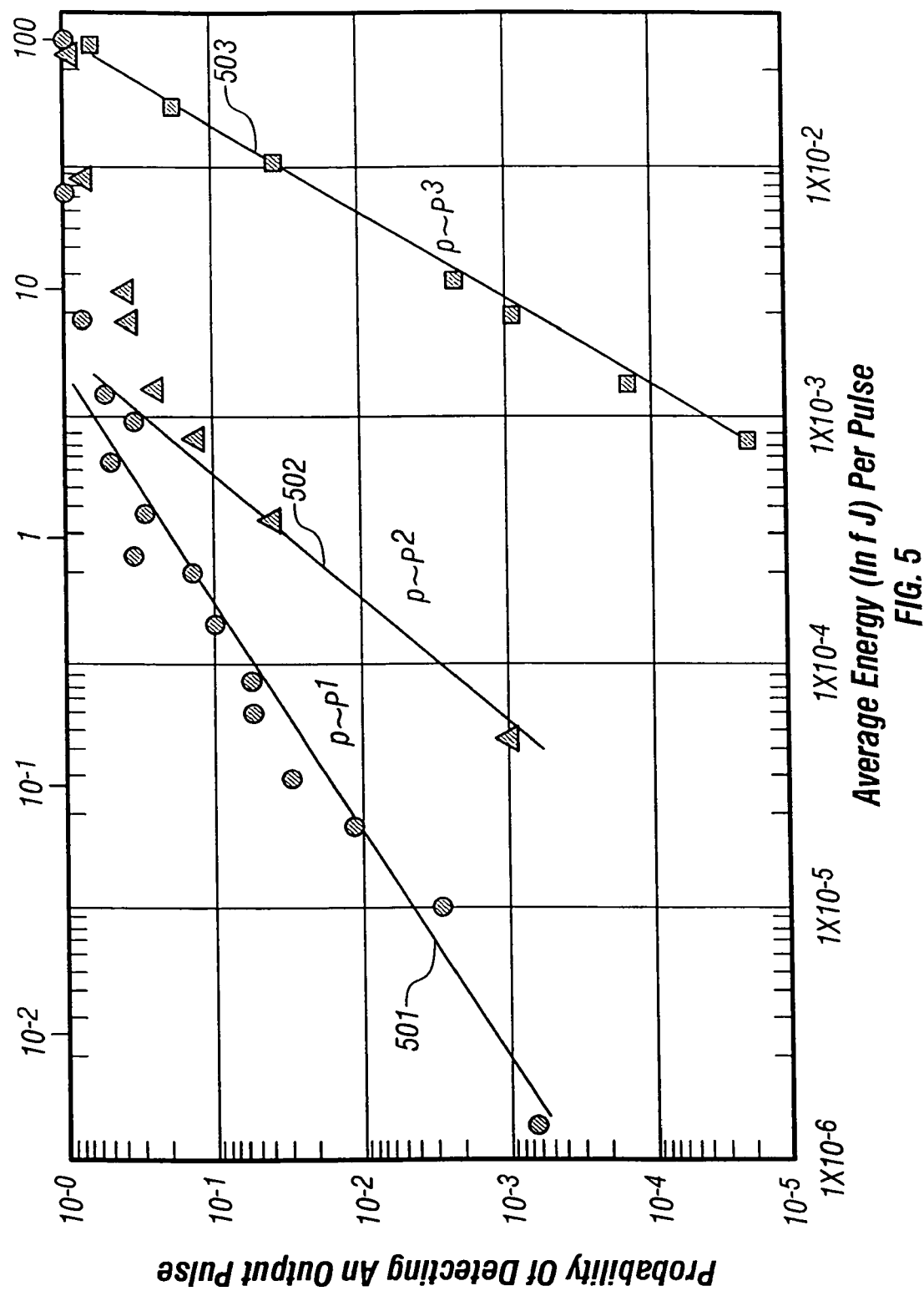
FIG. 5 shows plots of the probability of detecting an output pulse from an SSPD as a function of either incident light energy per pulse or, equivalently, the number of photons per device, per pulse using the apparatus shown in FIG. 4A.

FIG. 5 shows plots of the probability of SSPD 12 producing an output voltage pulse in one experiment. In FIG. 5, the vertical axis indicates the probability of SSPD 12 detecting a photon in a single light pulse, based on the number of light pulses detected by pulse counter 60 over a long period of time. The lower horizontal axis indicates the average energy (in femtojoules) of each light pulse focused on SSPD 12 while the upper horizontal axis indicates the computed corresponding number of incident photons per light pulse, per 0.2×1 µm², which is the area of SSPD 12 in the experiment. The critical current, $I_c$, was experimentally determined to be around 45 µA.

Trace 501 corresponds to an SSPD 12 that was biased to 0.95 Ic (i.e., 95% of the critical current). Trace 501 shows the linear dependence of detection probability to the average number of photons per pulse, indicating single photon detection. Trace 502 corresponds to an SSPD 12 that was biased to 0.9 Ic. Trace 502 shows a quadratic dependence of detection probability to the average number of photons per pulse, indicating two photon detection. Further reducing the bias current of SSPD 12 to 0.7 Ic results in trace 503. Trace 503 shows a cubic dependence of detection probability to the number of photons per pulse, indicating three photon detection. From the foregoing, setting the bias current of SSPD 12 near its critical current allows single photon detection.

Figure 6A:
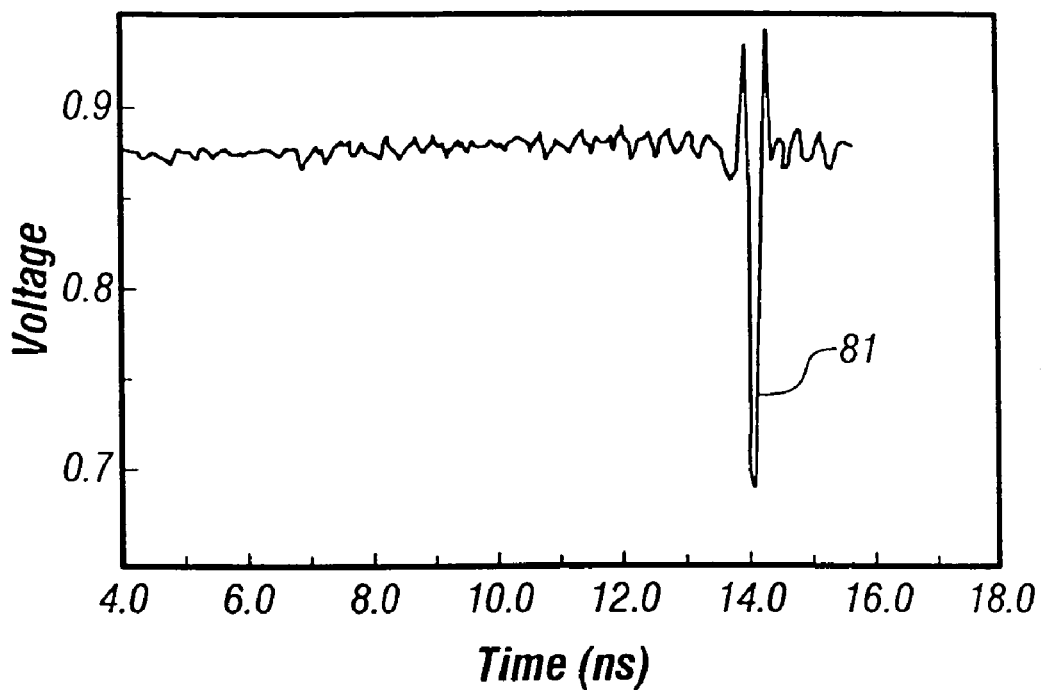
FIGS. 6A and 6B show waveforms of a typical output signal of the SSPD used in the apparatus shown in FIG. 4A.
Figure 6B:
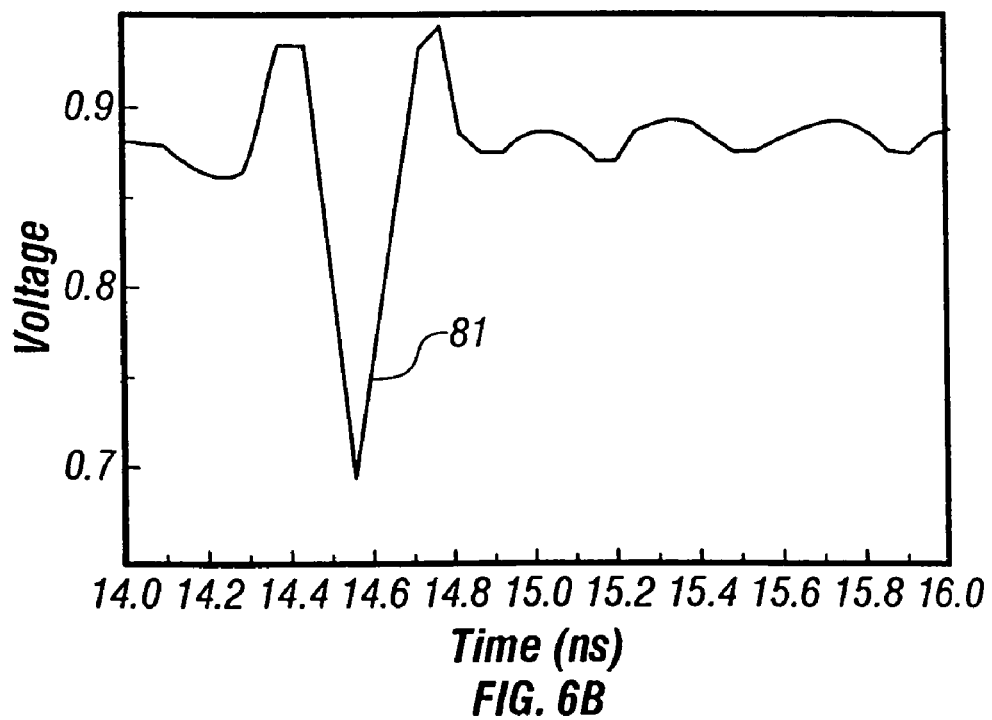

FIG. 6A shows a waveform of a typical output signal of SSPD 12. Pulse 81, which corresponds to a detected incident photon, is readily distinguishable from background noise. As shown in the magnified view of FIG. 6B, pulse 81 has full width half maximum (FWHM) of about 100 ps. The bandwidth of pulse 81 was limited by the bandwidth of the data acquisition equipment used, not by SSPD 12. In FIGS. 6A and 6B, the vertical axis is in an arbitrary unit of voltage while the horizontal axis is in nanoseconds. An SSPD in accordance with this disclosure simplifies the detection process by providing an output voltage pulse that is readily read using conventional data acquisition techniques.

Spectroscopic information about the energy of the detected photon can also be obtained by analyzing the shape of the output signal of an SSPD. A hot electron is created when a photon is absorbed by the SSPD and breaks a so-called Cooper pair. The hot electron collides with other Cooper pairs in the SSPD, thereby breaking the Cooper pairs and creating more hot electrons. Because the number of broken Cooper pairs is proportional to the energy of the incident photon, and the shape of the output voltage pulse depends on the number of hot electrons, the shape of the output voltage pulse depends on the energy of the incident photon. For example, one could integrate the output voltage pulse of SSPD 12 as a function of time and find a correlation between the incident photon energy and the integral of the pulse.

Figure 7:
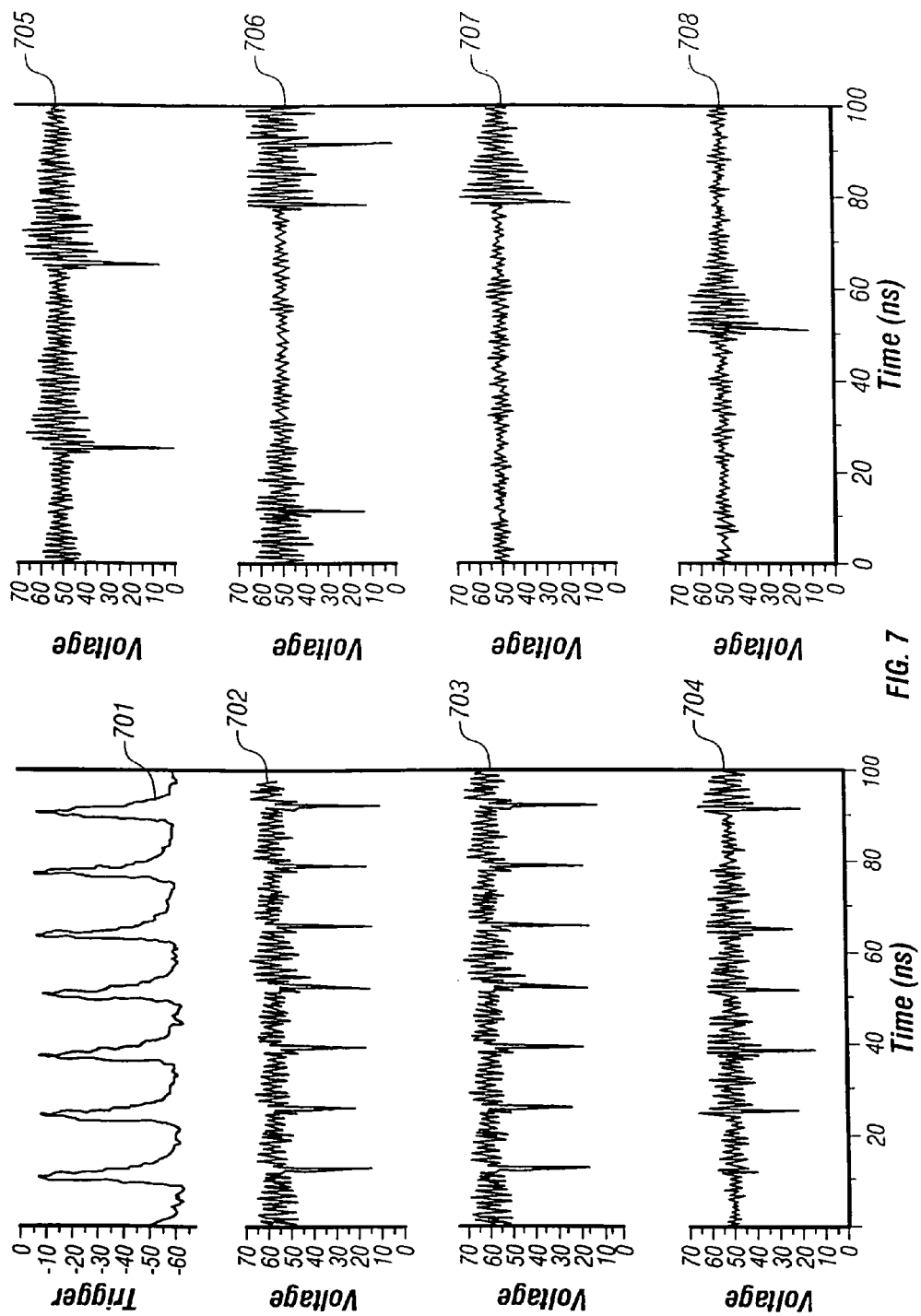
FIG. 7 shows oscilloscope traces of output signals of the SSPD used in the apparatus shown in FIG. 4A.

FIG. 7 shows traces captured by oscilloscope 71 (FIG. 4A) in one experiment. Trace 701 shows the output signal of photodetector 64 upon detection of light pulses received from beam splitter 62. Trace 702 shows the amplified output signal of SSPD 12 for incident light pulse powers corresponding to an average of 100 incident photons per device area, per light pulse. In that case, the probability of SSPD 12 producing an output voltage pulse for each incident light pulse is 100%. Trace 703 shows the amplified output signal of SSPD 12 for incident light pulse powers corresponding to an average of 40 photons per device area, per light pulse. Similarly, traces 704, 705, 706, 707, and 708 show the amplified output signal of SSPD 12 for incident pulse powers corresponding to an average of 10, 5, 5, 1, and 1 photon per device area, per light pulse, respectively. Traces 707 and 708 demonstrate that SSPD 12 has enough sensitivity to detect a single photon. The traces also show that the detected pulse has approximately the same shape and amplitude regardless of how many photons are absorbed.

Figure 8A:
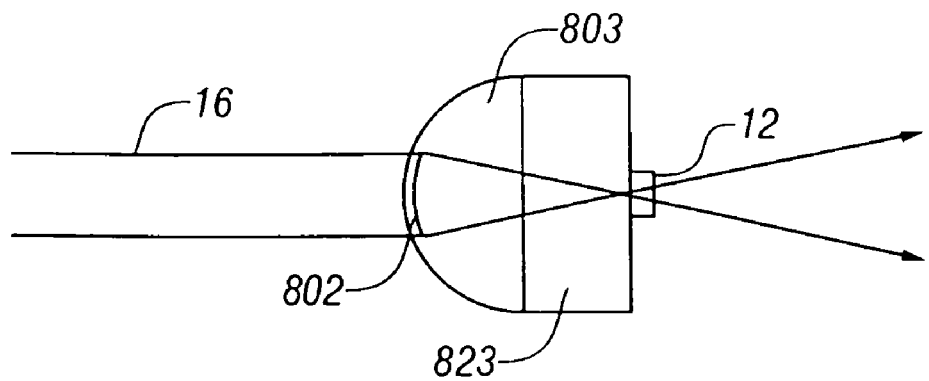
FIGS. 8A–8C show schematic diagrams of various arrangements for coupling light to an SSPD.
Figure 8B:
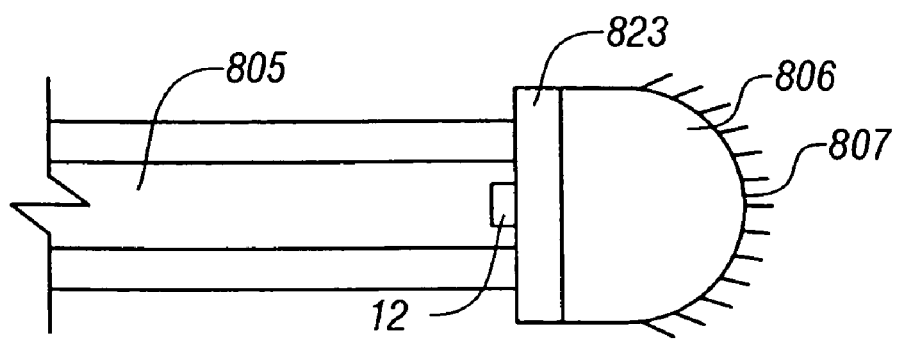
Figure 8C:
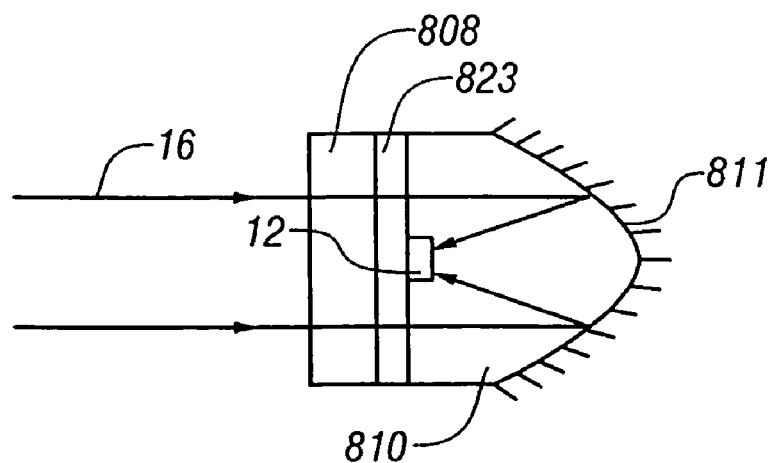

FIGS. 8A–8C show diagrams of various arrangements for coupling light to the SSPD. Note that FIGS. 8A–8C are schematic representations and not drawn to scale (for example, SSPD 12 in actuality has practically zero thickness relative to its substrate). In FIG. 8A, incident light beam 16 passes through an aperture diaphragm 802 in front of a hemispherical lens 803. Substrate 823 of SSPD 12 functions as an optical extension and is directly bonded to hemispherical lens 803. Light beam 16 is focused onto SSPD 12 through hemispherical lens 803 and substrate 823. Hemispherical lens 803 and substrate 823 are preferably of the same material so that the diameter of aperture diaphragm 802 can be maximized. SSPD 12 can also be mounted with its superconducting film directly facing light beam 16 (on the other end of substrate 823) by extending hemispherical lens 803. In FIG. 8B, SSPD 12 receives the incident light beam from a single-mode or multi-mode fiber 805. Light that is not absorbed by SSPD 12 passes through substrate 823 and into mirror 806 where the light is reflected off a mirrored surface 807 and focused onto SSPD 12. In FIG. 8C, incident free-propagating light beam 16 passes through anti-reflective coating 808, substrate 823, and quartz (or silicon for infrared applications) parabolic lens 810. Light beam 16 is reflected off mirrored surface 811 and focused onto SSPD 12.

While specific embodiments of this invention have been described, it is to be understood that these embodiments are illustrative and not limiting. Many additional embodiments that are within the broad principles of this invention will be apparent to persons skilled in the art.

What is claimed is:

1. A method of detecting photons, comprising the acts of:
   providing a superconducting strip maintained at a temperature below its critical temperature;
   electrically biasing said superconducting strip at a level near and below said superconductor strip's critical current;
   wherein said superconducting strip is maintained in a non-resistive superconducting state;
   directing at least one photon on said superconducting strip; and
   detecting said at least one photon incident on said superconductor strip by generating an output voltage pulse as a function of the superconducting strip going from a non-resistive superconductive state to a resistive state due to an increase in current density within the superconducting strip above the critical current.

2. The method of claim 1 wherein said at least one photon is detected by measuring the output pulse from said superconductor strip.

3. The method of claim 2 wherein said superconductor strip has a width equal to or less than about 200 nm.

4. The method of claim 2 wherein said output pulse has a voltage greater than 1 mV.

5. The method of claim 1 wherein said superconductor strip is of niobium nitride.

6. The method of claim 1 wherein said at least one photon has a wavelength between the visible and the far infrared spectral regions.

7. The method of claim 1 wherein said superconductor strip defines a meander.

8. The method of claim 1 wherein said at least one photon creates a resistive region extending across the width of said superconductor strip.

9. The method of photon detection of claim 1 further comprising:
  directing light from at least one switching transistor unto said biased superconducting strip, said light comprising said at least one photon.

10. The method of photon detection of claim 9 further comprising:
  receiving the output voltage pulse; and
  providing switching timing information about said at least one switching transistor as a function of receiving the output voltage pulse.

11. A photon detector comprising:
  a superconducting film coupled to a bias source, wherein said superconducting film is maintained at a temperature below its critical temperature and biased near and below its critical current;
  wherein said superconducting film is maintained in a non-resistive superconducting state; and
  wherein said superconducting film has a dimension which allows detection of a single incident photon by causing the superconducting strip to transition from the non-resistive superconducting state to a resistive state due to an increase in current density within the superconducting film above the critical current.

12. The photon detector of claim 11 wherein said superconducting film is of niobium nitride.

13. The photon detector of claim 11 wherein a width of said superconducting film is equal to or less than about 200 nm.

14. The photon detector of claim 11 wherein said superconducting film forms a detectable resistive region upon absorption of said single incident photon.

15. The photon detector of claim 14, wherein said resistive region extends across said dimension of said superconducting film.

16. The photon detector of claim 11 further comprising:
  a plurality of contact pads coupled to ends of said superconducting film; and
  wherein said bias source is coupled to said superconducting film at said plurality of contact pads.

17. The photon detector of claim 11 wherein said superconducting film defines a meander.

18. The photon detector of claim 16 wherein said contact pads include gold.

19. The photon detector of claim 11 wherein said at least one photon is coupled to said superconducting film using an optical fiber.

20. The photon detector of claim 11 wherein said at least one photon is coupled to said superconducting film through a hemispherical lens.

21. The photon detector of claim 11, wherein said single photon generates an output pulse from said superconducting film having a voltage greater than 1 mV.

22. The photon detector of claim 11 wherein said superconducting film is configured to receive light emissions from at least one switching transistor, the light emissions comprising said single incident photon.

23. A method of detecting photons, comprising the acts of:
  maintaining a superconducting strip below its critical temperature;
  biasing said superconducting strip below its critical current;
  wherein said superconducting strip is maintained in a non-resistive superconducting state;
  directing at least one photon toward said superconducting strip;
  providing a mirror to reflect the at least one photon unto said superconducting strip in the event that the at least one photon is not directly incident upon the superconducting strip; and
  whereby the superconducting strip detects the at least one photon incident thereon by generating an output voltage pulse as a function of the superconducting strip going from a non-resistive superconductive state to a resistive state due to an increase in current density within the superconducting strip above the critical current.

24. The method of claim 23 further comprising maintaining the superconducting strip substantially below its critical temperature.

25. The method of claim 24 wherein said superconducting film comprises a niobium nitride superconducting film, and further comprising the operation of maintaining the niobium nitride superconducting film at a temperature at or below 4 Kelvin–10 Kelvin.

26. The method of claim 24 further comprising:
  providing a cryogenic amplifier coupled with said superconducting film to amplify an output signal from the superconducting film that is a function of the detection of said one or more photons.

27. A photon detector for detecting one or more photons from a light source, the photon detector comprising:
  a superconducting film coupled with a substrate;
  a mirror optically coupled with the superconducting film, the mirror arranged to reflect the one or more photons toward the superconducting film;
  wherein said superconducting film has a dimension which allows detection of the one or more photons when said superconducting film is maintained at a temperature below its critical temperature and biased below its critical current so that the film is in a non-resistive superconducting state; and
  wherein the one or more photons may be directly incident upon the superconducting film or reflected off the mirror onto the superconducting film to cause the superconducting film to become resistive and thereby detect the one or more photons due to an increase in current density within the superconducting film above the critical current.

28. The photon detector of claim 27 wherein said superconducting film is maintained at a temperature substantially below its critical temperature.

29. The photon detector of claim 28 wherein said superconducting film comprises a niobium nitride superconducting film maintained at a temperature at or below 4 Kelvin–10 Kelvin.

30. The photon detector of claim 27 further comprising:
  a cryogenic amplifier coupled with said superconducting film to amplify an output that is a function of the detection of said one or more photons.

31. A method of detecting photons, comprising the acts of:
providing a superconducting strip maintained at a temperature substantially below its critical temperature so that the superconducting strip is in a non-resistive superconducting state and below the superconducting transition region;
electrically biasing said superconducting strip at a level near said superconductor strip's critical current so that the superconducting strip remains in the non-resistive superconductive state;
directing at least a single photon on said biased superconducting strip;
detecting said single photon incident on said superconductor strip by generating an output voltage pulse as a function of the superconducting strip going from a non-resistive superconductive state to resistive state due to an increase in current density within the superconducting strip above the critical current.

32. The photon detector of claim 31 wherein said superconducting strip comprises a niobium nitride superconducting strip maintained at a temperature at or below 4 Kelvin–10 Kelvin.

33. A photon detector comprising:
a superconducting film maintained at a temperature below its critical temperature;
said superconducting film further coupled with a bias source to bias said superconducting film below its critical current;
whereby the superconducting film is maintained in a non-resistive superconducting state; and
wherein said superconducting film has a dimension which allows detection of a single incident photon by transitioning from the non-resistive state to a resistive state due to an increase in current density within the superconducting strip above the critical current when the single photon is incident thereon.

34. The photon detector of claim 33 wherein said superconducting film comprises a niobium nitride superconducting film maintained at a temperature at or below 4 Kelvin–10 Kelvin.

* * * * *